United States Patent [19]

Nakao

[11] Patent Number: 4,714,511
[45] Date of Patent: Dec. 22, 1987

[54] METHOD AND APPARATUS FOR ADHERING A TAPE OR SHEET TO A SEMICONDUCTOR WAFER

[75] Inventor: Kunimichi Nakao, Yokohama, Japan

[73] Assignee: Fujitsu Limited, Kanagawa, Japan

[21] Appl. No.: 833,308

[22] Filed: Feb. 25, 1986

[30] Foreign Application Priority Data

Feb. 27, 1985 [JP] Japan .................................. 60-39996

[51] Int. Cl.⁴ ............................................. B32B 31/20
[52] U.S. Cl. .................................... 156/285; 156/286; 156/382
[58] Field of Search ............... 156/285, 286, 381, 382, 156/104, 105

[56] References Cited

U.S. PATENT DOCUMENTS 3,330,714 7/1967 Gunderson ........................... 156/286
4,242,162 12/1980 Ronwing et al. ..................... 156/382
4,283,242 8/1981 Negler et al. ......................... 156/382

FOREIGN PATENT DOCUMENTS 0008016 3/1970 Japan .................................... 156/285

Primary Examiner—Caleb Weston
Attorney, Agent, or Firm—Armstrong, Nikaido, Marmelstein & Kubovcik

[57] ABSTRACT

A method and apparatus for adhering an adhesive-backed tape or sheet to the back surface of a semiconductor wafer having electrical patterns already formed on the front surface thereof. The apparatus comprises a housing forming a vacuum working chamber containing a circular supporting table for the semiconductor wafer and a roller mechanism for exerting pressure on an adhesive-backed tape or sheet having the adhesive surface thereof located above and facing the semiconductor wafer. In the adhering method, the adhesive-backed tape or sheet is first adhered only at the peripheral edges of the semiconductor wafer, and then the central portion of the adhesive-backed tape or sheet is drown against the semiconductor wafer by a change in pressure in the vacuum working chamber. In this method, since an external force is not applied to the front surface of the semiconductor wafer, the electrical patterns thereon will not be damaged during the adhesion of the adhesive-backed tape or sheet to the back surface of the semiconductor wafer.

12 Claims, 4 Drawing Figures

METHOD AND APPARATUS FOR ADHERING A TAPE OR SHEET TO A SEMICONDUCTOR WAFER

BACKGROUND OF THE INVENTION

1. Field of the Invention

This invention relates to a method and apparatus for adhering a tape or sheet to a semiconductor wafer.

2. Description of the Related Art

In the production of semiconductor devices, such as integrated circuits (IC), large scale integrated circuits (LSI), and very large scale integrated circuits (VLSI), a disk-like semiconductor wafer is formed with a number of electrical patterns on the surface thereof and then cut into a predetermined number of squares to obtain semiconductor chips for individual devices. The cutting is usually effected by a diamond cutter in a so-called dicing process. However, before the cutting, an adhesive-backed tape or sheet is conventionally adhered to the back surface of the wafer to prevent cut chips from scattering into individual pieces.

When adhering the tape or sheet to the back surface of the wafer, if an excessive pressure is used to press the tape against the wafer, the wafer surface will be damaged, or it will become difficult to obtain uniform adhesion between the tape and wafer. Therefore, an improved technique for uniformly adhering a tape or sheet to a semiconductor wafer has long been desired.

A method for adhering a tape to a wafer is known in the prior art, in which method a patterned semiconductor wafer is placed on a wafer supporting table and an adhesive-backed tape, made of, for example, vinyl chloride, is then brought into contact with the wafer surface. Then, the entire surface of the adhesive-backed tape is rolled or brushed with a rubber roller or brush. However, in this method, there is a disadvantage in that the patterned surface of the wafer which is in contact with the supporting table could be damaged by a physical pressure applied to the back surface of the wafer by this rolling or brushing. In addition, air bubbles might form between the tape and wafer, thus preventing a uniform adhesion of the tape to the wafer.

In another known method, a patterned semiconductor wafer is placed on a wafer supporting table in a vacuum chamber. In the vacuum chamber, an adhesive-backed tape is brought into contact with the wafer by a pressure difference created on the respective sides of the tape. According to this method, air bubbles are prevented from forming between the tape and wafer. However, this method has a disadvantage in that the patterned surface of the wafer which is contact with the supporting table could be damaged when the tape is pressed against the wafer by the pressure difference applied to the tape.

SUMMARY OF THE INVENTION

Accordingly, an object of the present invention is to provide a method and apparatus for adhering a tape or sheet to a semiconductor wafer, in which air bubbles are not formed between the tape and wafer and a uniform adhering property is ensured.

Another object of the present invention is to provide a method and apparatus for adhering an adhesive-backed tape or sheet to a semiconductor wafer, in which the patterned surface of the wafer is not damaged when the tape is adhered to the entire back surface of the wafer.

Still another object of the present invention is to provide a method and apparatus for adhering an adhesive-backed tape or sheet to a semiconductor wafer, capable of improving the productivity of semiconductor devices by being applicable to an automatic production system.

According to one aspect of the present invention, there is provided an apparatus for adhering an adhesive-backed tape or sheet to a semiconductor wafer, comprising; a housing means defining therein a vacuum working chamber; a table in the vacuum working chamber for supporting a disk-shaped semiconductor wafer, having a front surface on which electrical patterns are formed and a back surface, in such a manner that only the peripheral portion of the wafer is in contact with the table; means for holding an adhesive-backed tape or sheet having at least one adhesive surface at a predetermined position in the chamber, in such a manner that the adhesive surface thereof is located opposite to the back surface of the semiconductor wafer and a predetermined small clearance is maintained therebetween; means for physically pressing the adhesive-backed tape or sheet with a slight force against the semiconductor wafer, so that the adhesive-backed tape or sheet is provisionally adhered to the back surface of the wafer at least over an area of the peripheral portion of the wafer; and, means for regulating the air pressure in the working chamber.

According to another aspect of the present invention, there is provided a method for adhering an adhesive-backed tape or sheet to a semiconductor wafer, having a front surface on which electrical patterns are formed and a back surface, the method comprising the following steps of: placing a disk-shaped semiconductor wafer on a table in a working chamber, in such a manner that only the peripheral portion of the wafer is in contact with the table; setting an adhesive-backed tape or sheet having at least one adhesive surface at a predetermined position in the chamber, in such a manner that the adhesive surface thereof is located opposite to the back surface of the semiconductor wafer and a predetermined small clearance is maintained therebetween; reducing the air pressure in the working chamber; physically pressing the adhesive-backed tape or sheet with a slight force against the semiconductor wafer, so that the adhesive-backed tape or sheet is provisionally adhered to the back surface of the wafer at least over an area of the peripheral portion of the wafer; and, increasing the air pressure in the working chamber to completely adhere the tape or sheet to the entire back surface of the semiconductor wafer due to the change in pressure.

DESCRIPTION OF THE PREFERRED EMBODIMENTS

Figure 1:
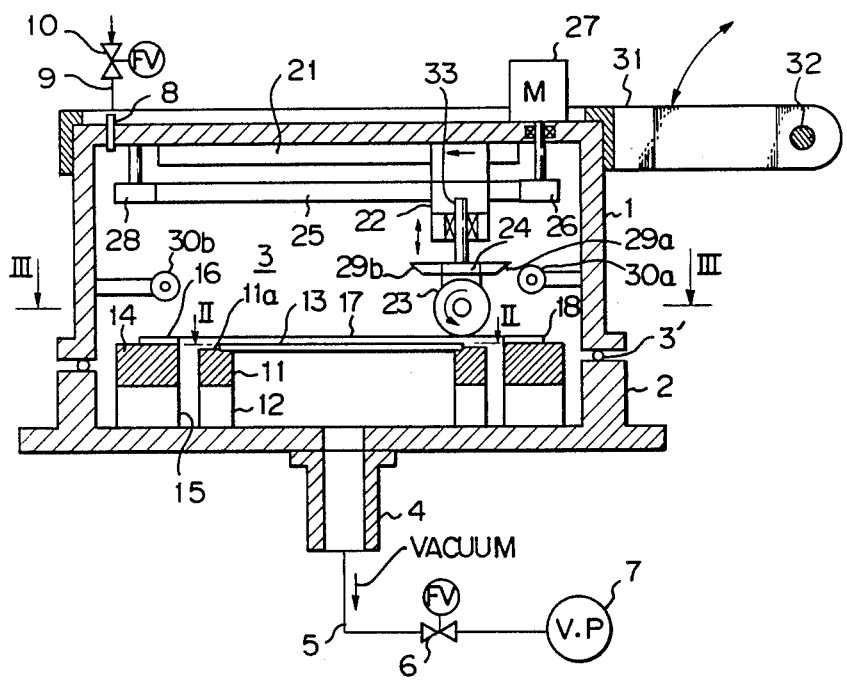
FIG. 1 is a cross-sectional view of an apparatus for adhering a tape or sheet to a semiconductor wafer according to the present invention.

FIG. 1 shows an adhering apparatus according to the present invention, in which an upper housing 1 and a lower housing 2 cooperate to constitute a vacuum chamber 3. An O ring seal 3' is arranged between the abutting faces of the upper and lower housing 1 and 2 to ensure an airtight seal of the chamber 3. The lower chamber 2 is provided with an air outlet 4 connected, via a vacuum line 5 having an air valve 6, to a vacuum pump 7, so that air pressure in the chamber 3 can be reduced to about 20 Torr or less. The upper chamber 1 is provided with an air inlet 8 which is open to the atmosphere via an air line 9 having an air valve 10, so that air pressure in the chamber 3 can be increased to atmospheric pressure or a value in the vicinity thereof.

Figure 2:
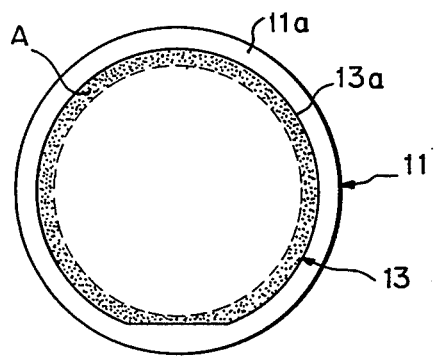
FIG. 2 is a view taken along the line II–II in FIG. 1.
Figure 3:
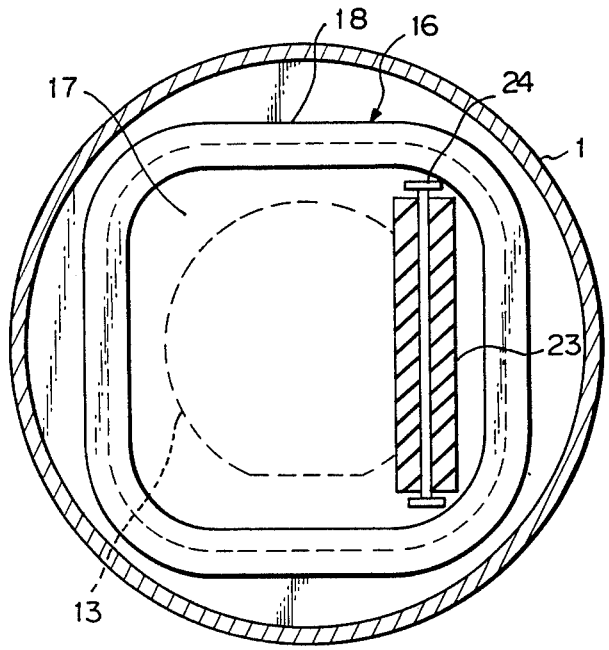
FIG. 3 is a sectional view taken along the line III–III in FIG. 1.

A cylindrical supporting table 11 horizontally arranged on legs 12 is provided in the lower housing 2. The table 11 has a circular-shaped supporting top surface 11a, as seen from FIG. 2, on which a substantially disk-shaped semiconductor wafer 13 is horizontally placed so that the peripheral edge 13a thereof is in contact with the supporting surface 11a of the table 11. A tape-mounting jig 14 is also arranged in the lower housing 2 on legs 15, outside the periphery of the table 11. The tape mounting jig 14 is used to fixedly secure a sheet adhering unit 16 by any one of a not shown conventionally known means. The sheet adhering unit 16 comprises, as shown in FIG. 3, a thin adhesive-backed sheet 17, made of, for example, vinyl chloride, and having a resin adhesive surface on one surface, and a mounting frame 18 for securing the adhesive-backed sheet 17 by the peripheral edge thereof.

The inner wall of the upper housing 1 is provided with horizontal guide shafts 21 along which a roller base 22 is movably supported. A roller 23 is made of, for example, rubber, is rotatably mounted on a roller frame 24 having a vertical shaft 33 movably supported on the roller base 22. The roller base 22 is connected to a drive belt 25 which extends between a drive pulley 26 attached to an output shaft of a drive motor 27 mounted on the upper housing 1 and an idle pulley 28 rotatably mounted on the upper housing 1, so that the roller base 22, and accordingly, the roller 23, can be moved by the motor 27 in the horizontal direction by a predetermined stroke along the guide shafts 21. The roller frame 24 has a pair of cam members 29a and 29b which engage with a pair of rollers 30a and 30b, respectively, rotatably mounted on the side walls of the upper chamber 1, so that the roller frame 24, and accordingly, the roller 23, is raised and separated from the adhesive-backed sheet 17 at the respective ends of the stroke of the roller 23.

The upper housing 1 is rigidly secured to an arm 31 which is pivotably moved, in the directions shown by an arrow, about a shaft 32 connected to a machine base (not shown) by any suitable means known in the prior art, so that the chamber 3 can be opened by lifting the upper housing 1 to separate it from the lower housing 2.

The steps of adhering the tape or sheet 17 to the semiconductor wafer 13 will now be describe. First, the chamber 3 is opened by lifting the upper housing 1 and separating it from the lower housing 2. Note, in another embodiment of the present invention, the lower housing 2 may be moved downward to open the chamber 3. A disk-like semiconductor wafer 13 having electrical patterns already formed on the front surface thereof is placed on the cylindrical table 11, as mentioned above. In this state, the major central part of the front surface of the semiconductor wafer 13 on which the above mentioned electrical patterns are formed is not in contact with the upper supporting face 11a of the table 11. After being set on the table 11, the wafer 13 is positioned so that its back surface faces upward. Then, the sheet adhering unit 16 is fixedly set on the tape-mounting jig 14 so that the adhesive side of the adhesive-based sheet 17 faces downward and a small clearance, for example, 0.4 to 0.5 mm, is maintained between the sheet 17 and the back surface of the wafer 13. Then, the upper housing 1 is lowered and the chamber 3 is closed, as mentioned above, and air pressure in the chamber 3 is reduced by the vacuum pump 7 to 20 Torr or less. When this vacuum condition is established, the motor 27 drives the roller base 22 along the guide shafts 21. After the cam member 29a or 29b moves away from the guide roll 30a or 30b, the roller 23 is allowed to roll over the back surface of the semiconductor wafer 13 and slightly press the adhesive-backed sheet 17 against the wafer 13 by a pressure substantially equal to that exerted on the roller 23 by the force of gravity, i.e., about 200 to 300 g, so that the adhesive-backed sheet 17 is provisionally adhered to the back surface of the wafer 13, over at least the area of the peripheral edge of the wafer 13 indicated by A in FIG. 2. At the end of its stroke, the roller 23 is raised and separated from the adhesive-backed sheet 17, as mentioned above. Note, in another embodiment of the present invention, a brush is used in place of the roller 23. After the roller 23 is raised, the air valve 10 is opened to introduce atmospheric air into the chamber 3 so that the pressure in the chamber 3 becomes equal to the atmospheric pressure or a value in the vicinity thereof. Due to this pressure increase, the thin adhesive-backed sheet 17 is drawn against the semiconductor wafer 13 and the completely adhered to the entire back surface thereof. Therefore, a uniform, stable adhesion between the sheet 17 and the wafer 13 is established and air bubbles are not formed therebetween. Then the upper housing 1 is raised to open the chamber 3, and the sheet adhering unit 16 is removed together with the semiconductor wafer 13 adhered thereto.

Figure 4:
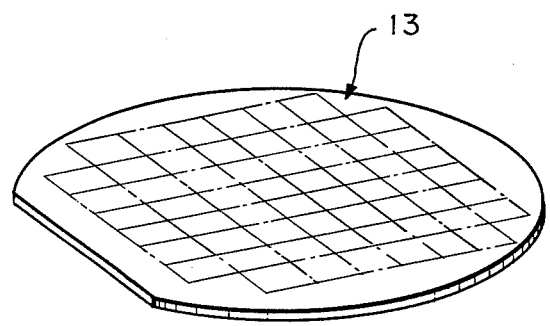
FIG. 4 is a perspective view of a semiconductor wafer.

The semiconductor wafer 13 is then cut along a plurality of dotted lines, as seen in FIG. 4, into a number of square-shaped semiconductor chips for individual devices, by a so-called dicing process. During this process, the individual cut pieces are prevented from scattering into individual pieces, as a uniform and stable adhesion without air bubbles is maintained between the wafer 13 and adhesive-backed sheet 17. As is obvious, the surface of the wafer 13 is not damaged, since no unfavorable external force is applied to the front surface of the semiconductor wafer 13 during the adhering operation. Each of the cut individual semiconductor chips are used, as mentioned previously, for producing semiconductor devices, such as integrated circuits (IC), large scale integrated circuits (LSI), or very large scale integrated circuits (VLSI).

I claim:

1. An apparatus for adhering a tape or sheet material having an adhesive back surface to a back surface of a substantially disk-shaped semiconductor wafer having a front surfce with an electric pattern being formed thereon, said apparatus comprising:
   a housing having a vacuum working chamber therein;
   a table provided in said working chamber and having a cylindrical supporting section for horizontally supporting the semiconductor wafer thereupon in a manner such that only a peripheral portion of said front surface of said semiconductor wafer is in contact therewith;

means for provided in said working chamber for holding said tape or sheet material at a predetermined position such that said adhesive back surface of said tape or sheet material is located to said back surface of said semiconductor wafer and a predetermined clearance is maintained therebetween;

means for physically pressing said tape or sheet material against said semicondutor wafer in order to provisionally adhere them together along at least the periphery thereof using such slight pressure that said wafer will not be damaged; and a valve means for regulating air pressure in said vacuum working chamber for successive complete adhering.

2. An apparatus for adhering a tape or sheet material having an adhesive back surface to a back surface of a semiconductor wafer having a front surface with an electric pattern being formed thereon, said apparatus comprising:

a housing having a vacuum working chamber therein;

a table provided in said working chamber for supporting the semiconductor wafer thereupon in a manner such that only a peripheral portion of said front surface of said semiconductor wafer is in contact therewith;

a means provided in said working chamber for holding said tape or sheet material at a predetermined position such that said adhesive back surface of said tape or sheet material is located to said back surface of said semiconductor wafer and a predetermined clearance is maintained therebetween;

means for physically pressing said sheet material against said semiconductor wafer in order to provisionally adhere them together along at least the periphery thereof comprising a rubber roller which is rollingly moved over said tape or sheet material and is slightly pressed against said tape or sheet material by a pressure substantially equal to the force of gravity exerted on said rubber roller; and means for regulating air pressure in said vacuum working chamber for successive complete adhering.

3. An apparatus as set forth in claim 2, wherein said rubber roller is rotatably mounted on a roller frame which is vertically movably supported on a roller base, which roller base is, in turn, horizontally moved along guide shafts within a predetermined stroke.

4. An apparatus as set forth in claim 3, wherein said roller frame is provided with a pair of cam members which engage with a pair of rolls, respectively, situated in said housing, so that said roller is raised and separated from said adhesive-backed tape or sheet, when said roller reaches the respective ends of its stroke.

5. An apparatus for adhering a tape or sheet material having an adhesive back surface to a back surface of a semiconductor wafer having a front surface with an electric pattern being formed thereon, said apparatus comprising:

a housing having a working chamber therein;

a first table provided in siad working chamber and having a cylindrical supporting section for supporting the semiconductor wafer thereupon in a manner such that only a peripheral portion of said front surface of said semiconductor wafer is in contact therewith;

a second table provided in said working chamber for holding a periphery of said sheet material such that said adhesive back surface of said sheet material is slightly higher than and does not directly contact with said back surface of said semiconductor wafer;

means for physically pressing said sheet material against said semiconductor wafer in order to provisionally adhere them together along at least the periphery thereof using such slight pressure that said wafer will not be damaged; and a valve means for controlling air pressure within said working chamber in a manner such that said working chamber is evacuated to a substantial vacuum prior during provisional adhering and after the provisional adhering substantially atmospheric air pressure is introduced to both sides of said provisionally adhered sheet material and semiconductor wafer for the successive complete adhering operation.

6. An apparatus as set forth in claim 5, wherein said housing comprises an upper and lower housing, and said upper and lower housings are movable respect to one another so that said working chamber is opened and closed by raising and lowering one of said upper and lower housings and when said working chamber is closed an airtight seal is established between said working chamber and outside.

7. A method for adhering a tape or sheet material to a semiconductor wafer having a front surface on which electrical patterns are formed and a back surface, said method comprising the steps of:

placing a substantially disk-shaped semiconductor wafer on a table in a working chamber in a manner such that only the peripheral portion of said wafer is in contact with said table;

supporting an adhesive-backed tape or sheet having a diameter larger than that of wafer above said wafer in said chamber in a manner such that said adhesive surface thereof faces against the back surface of said semiconductor wafer with a small clearance maintained therebetween;

reducing the air pressure in said working chamber;

physically pressing said adhesive-backed tape or sheet against said semiconductor wafer by a slight force such that it will not damage said wafer so that said adhesive-backed tape or sheet provisionally adhere to the back surface of said semiconductor wafer along at least the periphery thereof; and introducing the atmospheric air into said working chamber so as to completely adhere them together.

8. A method as set forth in claim 7, wherein said small clearance between said adhesive-backed tape or sheet and said semiconductor wafer is from 0.4 to 0.5 mm.

9. A method as set forth in claim 7, wherein the air pressure in said working chamber is reduced down to 20 Torr or less and then returned to an atmospheric pressure.

10. A method as set forth in claim 7, wherein said atmospheric air is introduced into both sides of said provisionally adhered sheet material and semiconductor wafer.

11. A method for adhering a tape or sheet to a semiconductor wafer, having a front surface on which electrical patterns are formed and back surface, said method comprising the following steps of:

placing a substantially disk-shaped semiconductor wafer on a table in a vacuum working chamber in such a manner that only the peripheral portion of said wafer is in contact with said table;

setting an adhesive-backed tape or sheet having at least one adhesive surface at a predetermined position in said chamber, in such a manner that the at least one adhesive surface thereof is located opposite to the back surface of said semiconductor wafer and a predetermined small clearance is maintained therebetween;

reducing the air pressure in said working chamber;

physically pressing said adhesive-backed tape or sheet against said semiconductor wafer by a slight force such that it will not damage said wafer so that said wafer so that said adhesive-backed tape or sheet provisionally adheres to the back surface of said semiconductor wafer along at least the periphery thereof by using a rolling rubber roller over the top surface of said adhesive-backed tape or sheet; and introducing the atomospheric air into said working chamber so as to completely adhere them together.

12. A method as set forth in claim 11, wherin the weight of said roller is from 200 to 300 g.

* * * * *